United States Patent
Moon et al.

(10) Patent No.: US 7,115,986 B2
(45) Date of Patent: Oct. 3, 2006

(54) FLEXIBLE BALL GRID ARRAY CHIP SCALE PACKAGES

(75) Inventors: Ow Chee Moon, Singapore (SG); Eng Meow Koon, Singapore (SG)

(73) Assignee: Micron Technology, Inc., Boise, ID (US)

(*) Notice: Subject to any disclaimer, the term of this patent is extended or adjusted under 35 U.S.C. 154(b) by 87 days.

(21) Appl. No.: 09/874,631

(22) Filed: Jun. 5, 2001

(65) Prior Publication Data
US 2002/0164838 A1 Nov. 7, 2002

(30) Foreign Application Priority Data
May 2, 2001 (SG) .................................. 200102580

(51) Int. Cl.
*H01L 23/053* (2006.01)
*H01L 23/12* (2006.01)

(52) U.S. Cl. .................. 257/701; 257/700; 257/686; 257/692

(58) Field of Classification Search ............ 257/698, 257/784, 783, 782, 692, 696, 690, 700, 693, 257/780, 777, 686, 701
See application file for complete search history.

(56) References Cited

U.S. PATENT DOCUMENTS

| 3,239,496 A | 3/1966 | Jursich |
| 4,074,342 A | 2/1978 | Honn et al. |
| 4,807,021 A | 2/1989 | Okumura |

(Continued)

FOREIGN PATENT DOCUMENTS

| EP | 0475022 A1 | 3/1992 |
| EP | 0684644 | 11/1995 |
| EP | 0997942 A2 | 5/2000 |
| EP | 1009027 | 6/2000 |
| JP | 04030456 | 2/1992 |
| JP | 2002-028702/04 | 9/1999 |
| JP | 2000-183082 | 6/2000 |
| JP | 02000230964 | 8/2000 |
| JP | 2001077294 | 3/2001 |
| KR | 2001054744 | 7/2001 |
| WO | WO 99/65282 | 12/1999 |

OTHER PUBLICATIONS

U.S. Patent Application entitled Microelectronic Devices and Methods of Manufacture, filed Aug. 30, 2001, Ser. No. 09/944,465.
Isaak, H. et al., "Development of Flex Stackable Carriers" IEEE Electronic Components and Technology Conference, 2000 Proceedings 50th, May 21, 2000–May 24, 2000, Las Vegas, NV, USA, pp. 378–84, IEEE Catalog No: 00CH37070.
Copy of Australian Patent Office, Search Report, May 30, 2003, 4 pages.

(Continued)

*Primary Examiner*—S. V. Clark
(74) *Attorney, Agent, or Firm*—TraskBritt

(57) ABSTRACT

A method and apparatus for increasing the integrated circuit density in a semiconductor assembly. The assembly includes a flexible interposer substrate attached to an active surface and a back side of a first die, the interposer substrate wrapping around at least one side of the first die. The assembly also includes an array of discrete conductive elements connected to bond pads of the first die through conductive traces and exposed on an exterior surface of the interposer substrate for effecting an external electrical connection. The assembly may include a second die facing the first die and attached to the interposer substrate, the interposer substrate being wrapped around either the first or second die or, alternatively, being wrapped around both the first and second die.

41 Claims, 8 Drawing Sheets

U.S. PATENT DOCUMENTS

| | | | |
|---|---|---|---|
| 4,818,728 A | | 4/1989 | Rai et al. |
| 5,148,265 A | | 9/1992 | Khandros |
| 5,346,861 A | | 9/1994 | Khandros |
| 5,347,159 A | * | 9/1994 | Khandros et al. |
| 5,366,794 A | | 11/1994 | Nakao |
| 5,385,869 A | | 1/1995 | Liu et al. |
| 5,386,341 A | | 1/1995 | Olson et al. |
| 5,394,303 A | * | 2/1995 | Yamaji ........................ 361/749 |
| 5,397,921 A | | 3/1995 | Karnezos |
| 5,404,044 A | | 4/1995 | Booth et al. |
| 5,409,865 A | | 4/1995 | Karnezos |
| 5,422,205 A | | 6/1995 | Inoue et al. |
| 5,438,477 A | | 8/1995 | Pasch |
| 5,448,511 A | | 9/1995 | Paurus et al. |
| 5,468,681 A | | 11/1995 | Pasch |
| 5,489,804 A | | 2/1996 | Pasch |
| 5,504,277 A | | 4/1996 | Danner |
| 5,598,033 A | | 1/1997 | Behlen et al. |
| 5,646,446 A | | 7/1997 | Nicewarner, Jr. et al. |
| 5,663,530 A | | 9/1997 | Schueller et al. |
| 5,668,405 A | | 9/1997 | Yamashita |
| 5,674,785 A | | 10/1997 | Akram et al. |
| 5,679,977 A | | 10/1997 | Khandros |
| 5,683,942 A | | 11/1997 | Kata |
| 5,697,148 A | | 12/1997 | Lance, Jr. et al. |
| 5,710,071 A | | 1/1998 | Beddingfield et al. |
| 5,719,449 A | | 2/1998 | Strauss |
| 5,721,151 A | | 2/1998 | Padmanabhan et al. |
| 5,723,347 A | | 3/1998 | Hirano et al. |
| 5,739,585 A | | 4/1998 | Akram et al. |
| 5,742,100 A | | 4/1998 | Schroeder et al. |
| 5,747,982 A | | 5/1998 | Dromgoole et al. |
| 5,752,182 A | | 5/1998 | Nakatsuka et al. |
| 5,758,413 A | | 6/1998 | Chong et al. |
| 5,768,109 A | | 6/1998 | Gulick et al. |
| 5,776,797 A | * | 7/1998 | Nicewarner, Jr. et al. ... 438/107 |
| 5,777,391 A | | 7/1998 | Nakamura |
| 5,798,285 A | | 8/1998 | Bentlage et al. |
| 5,805,422 A | | 9/1998 | Otake et al. |
| 5,812,378 A | | 9/1998 | Fjelstad et al. |
| 5,818,113 A | | 10/1998 | Iseki et al. |
| 5,821,624 A | | 10/1998 | Pasch |
| 5,834,338 A | | 11/1998 | Takeda et al. |
| 5,834,366 A | | 11/1998 | Akram |
| 5,835,355 A | | 11/1998 | Dordi |
| 5,843,808 A | | 12/1998 | Karnezos |
| 5,844,168 A | | 12/1998 | Schueller et al. |
| 5,866,953 A | | 2/1999 | Akram et al. |
| 5,886,408 A | | 3/1999 | Ohki et al. |
| 5,891,753 A | | 4/1999 | Akram |
| 5,892,271 A | | 4/1999 | Takeda et al. |
| 5,898,224 A | | 4/1999 | Akram |
| 5,905,303 A | | 5/1999 | Kata |
| 5,973,389 A | | 10/1999 | Culnane et al. |
| 5,973,404 A | | 10/1999 | Akram et al. |
| 5,977,640 A | * | 11/1999 | Bertin et al. |
| 5,982,030 A | | 11/1999 | MacIntrye |
| 5,984,691 A | | 11/1999 | Brodsky et al. |
| 5,986,460 A | | 11/1999 | Kawakami |
| 5,990,545 A | | 11/1999 | Schueller et al. |
| 5,991,161 A | | 11/1999 | Samaras et al. |
| 6,005,776 A | | 12/1999 | Holman et al. |
| 6,008,543 A | | 12/1999 | Iwabuchi |
| 6,011,694 A | | 1/2000 | Hirakawa |
| 6,013,948 A | | 1/2000 | Akram et al. |
| 6,020,629 A | | 2/2000 | Farnworth et al. |
| 6,022,761 A | | 2/2000 | Grupen-Shemansky et al. |
| 6,024,584 A | | 2/2000 | Lemke et al. |
| 6,027,346 A | | 2/2000 | Sinsheimer et al. |
| 6,028,365 A | | 2/2000 | Akram et al. |
| 6,039,889 A | | 3/2000 | Zhang et al. |
| 6,040,630 A | | 3/2000 | Panchou et al. |
| 6,048,755 A | | 4/2000 | Jiang et al. |
| 6,050,832 A | | 4/2000 | Lee et al. |
| 6,057,178 A | | 5/2000 | Galuschki et al. |
| 6,060,782 A | | 5/2000 | Ohsono et al. |
| 6,064,114 A | | 5/2000 | Higgins, III |
| 6,072,233 A | | 6/2000 | Corisis et al. |
| 6,074,897 A | | 6/2000 | Degani et al. |
| 6,075,710 A | | 6/2000 | Lau |
| 6,079,991 A | | 6/2000 | Lemke et al. |
| 6,093,035 A | | 7/2000 | Lemke et al. |
| 6,116,921 A | | 9/2000 | Scholz et al. |
| 6,124,631 A | | 9/2000 | Cardot et al. |
| 6,127,736 A | | 10/2000 | Akram |
| 6,133,072 A | | 10/2000 | Fjelstad |
| 6,133,637 A | | 10/2000 | Hikita et al. |
| 6,137,062 A | | 10/2000 | Zimmerman |
| 6,137,164 A | | 10/2000 | Yew et al. |
| 6,137,183 A | | 10/2000 | Sako |
| 6,157,541 A | | 12/2000 | Hacke |
| 6,165,885 A | | 12/2000 | Gaynes et al. |
| 6,172,422 B1 | | 1/2001 | Chigawa et al. |
| 6,177,723 B1 | | 1/2001 | Eng et al. |
| 6,179,598 B1 | | 1/2001 | Brand |
| 6,191,487 B1 | | 2/2001 | Rodenbeck et al. |
| 6,208,521 B1 | * | 3/2001 | Nakatsuka |
| 6,208,525 B1 | | 3/2001 | Imasu et al. |
| 6,212,768 B1 | | 4/2001 | Murakami |
| 6,214,156 B1 | | 4/2001 | Takano et al. |
| 6,217,343 B1 | | 4/2001 | Okuno |
| 6,218,202 B1 | | 4/2001 | Yew et al. |
| 6,219,911 B1 | | 4/2001 | Estes et al. |
| 6,221,763 B1 | | 4/2001 | Gilton et al. |
| 6,222,265 B1 | | 4/2001 | Akram et al. |
| 6,225,688 B1 | * | 5/2001 | Kim et al. |
| 6,229,711 B1 | | 5/2001 | Yoneda |
| 6,232,666 B1 | | 5/2001 | Corisis et al. |
| 6,242,932 B1 | | 6/2001 | Hembree |
| 6,262,895 B1 | | 7/2001 | Forthun |
| 6,265,775 B1 | | 7/2001 | Seyyedy |
| 6,271,469 B1 | | 8/2001 | Ma et al. |
| 6,281,046 B1 | | 8/2001 | Lam |
| 6,285,081 B1 | | 9/2001 | Jackson |
| 6,291,265 B1 | | 9/2001 | Mess |
| 6,291,775 B1 | | 9/2001 | Saitoh |
| 6,291,884 B1 | | 9/2001 | Glenn et al. |
| 6,294,455 B1 | | 9/2001 | Ahn |
| 6,295,730 B1 | | 10/2001 | Akram |
| 6,300,679 B1 | * | 10/2001 | Murkerji et al. |
| 6,310,288 B1 | | 10/2001 | Moden |
| 6,323,060 B1 | | 11/2001 | Isaak |
| 6,338,985 B1 | | 1/2002 | Greenwood |
| 6,376,769 B1 | * | 4/2002 | Chung ........................ 174/52.2 |
| 6,404,648 B1 | | 6/2002 | Slupe et al. |
| 6,407,450 B1 | | 6/2002 | Verma et al. |
| 6,413,102 B1 | | 7/2002 | Jiang et al. |
| 6,429,516 B1 | | 8/2002 | Tsunoi |
| 6,432,737 B1 | | 8/2002 | Webster |
| 6,452,807 B1 | | 9/2002 | Barrett |
| 6,468,831 B1 | | 10/2002 | Leong et al. |
| 6,482,676 B1 | | 11/2002 | Tsunoi et al. |
| 6,486,544 B1 | * | 11/2002 | Hashimoto ................. 257/686 |
| 6,489,676 B1 | | 12/2002 | Taniguchi et al. |
| 6,489,687 B1 | | 12/2002 | Hashimoto |
| 6,492,737 B1 | | 12/2002 | Imasu et al. |
| 6,515,324 B1 | | 2/2003 | Shibuya et al. |
| 6,518,677 B1 | | 2/2003 | Capote et al. |
| 6,534,853 B1 | | 3/2003 | Liu et al. |
| 6,552,910 B1 | | 4/2003 | Moon et al. |
| 6,563,223 B1 | | 5/2003 | Freeman |

| | | |
|---|---|---|
| 6,586,830 B1 | 7/2003 | Saito |
| 6,600,222 B1 | 7/2003 | Levardo |
| 6,634,100 B1 | 10/2003 | Akram et al. |
| 6,714,418 B1 | 3/2004 | Frankowsky et al. |
| 6,744,122 B1 | 6/2004 | Hashimoto |
| 6,791,195 B1 | 9/2004 | Urushima |
| 6,867,496 B1 * | 3/2005 | Hashimoto .......... 257/771 |
| 6,884,653 B1 | 4/2005 | Larson |
| 2001/0048157 A1 | 12/2001 | Murtuza |
| 2001/0053563 A1 | 12/2001 | Kim et al. |
| 2002/0045611 A1 | 4/2002 | Abrams et al. |
| 2002/0079594 A1 | 6/2002 | Sakurai |
| 2002/0127769 A1 | 9/2002 | Ma et al. |
| 2002/0142513 A1 | 10/2002 | Fee et al. |
| 2002/0167092 A1 | 11/2002 | Fee et al. |
| 2002/0185661 A1 | 12/2002 | Kawanobe et al. |
| 2003/0012930 A1 | 1/2003 | Brousseau |
| 2003/0042595 A1 | 3/2003 | Canella |
| 2003/0134450 A1 | 7/2003 | Lee |
| 2004/0026773 A1 | 2/2004 | Koon et al. |
| 2004/0212055 A1 | 10/2004 | Exposito et al. |
| 2004/0217454 A1 | 11/2004 | Brechignac et al. |

OTHER PUBLICATIONS

Australian Search Report dated 11 Aug. 2004 (3 pages).
Australian Search Report dated 16 Aug. 2004 (4 pages).
Australian Search Report dated 08 Nov. 2004 (5 pages).
Al–Sarawi et al., "A review of 3–D packaging technology," Components, Packaging, and Manufacturing Technology, Part B: IEEE Transactions on Advanced Packaging, vol. 21, Issue 1, Feb. 1998, pp. 2–14.
Andros et al., "TBGA Package Technology," Components, Packaging, and Manufacturing Technology, Part B: IEEE Transactions on Advanced Packaging, vol. 17, Issue 4, Nov. 1994, pp. 564–568.
Clot et al., "Flip–Chip on Flex for 3D Packaging," 1999, 24th IEEE/CPMT, Oct. 18–19, 1999, pp. 36–41.
Ferrando et al., "Industrial approach of a flip–chip method using the stud–bumps with a non–conductive paste," Adhesive Joining and Coating Technology in Electronics Manufacturing 2000. Proceedings. 4th International Conference on, Jun. 18–21, 2000, pp. 205–211.
Gallagher et al., "A Fully Additive, Polymeric Process for the Fabrication and Assembly of Substrate and Component Level Packaging," The First IEEE International Symposium on Polymeric Electronics Packaging Oct. 26–30, 1997, pp. 56–63.
Geissinger et al., "Tape Based CSP Package Supports Fine Pitch Wirebonding," Electronics Manufacturing Technology Symposium, 2002, IEMT 2002, 27th Annual IEEE/SEMI International, Jul. 17–18, 2002, pp. 41–452.

Hatanaka, H., "Packaging processes using flip chip bonder and future directions of technology development," Electronics Packaging Technology Conference, 2002, 4th, Dec. 10–12, 2002, pp. 434–439.

Haug et al., "Low–Cost Direct Chip Attach: Comparison of SMD Compatible FC Soldering with Anisotropically Conductive Adhesive FC Bonding," IEEE Transactions on Electronics Packaging Manufacturing, vol. 23, No. 1, Jan. 2000, pp. 12–18.

Kloeser et al., "Fine Pitch Stencil Printing of Sn/Pb and Lead Free Solders for Flip Chip Technology," IEEE Transactions of CPMT–Part C, vol. 21, No. 1, 1998, pp. 41–49.

Lee et al., "Enhancement of Moisture Sensitivity Performance of a FBGA," Proceedings of International Symposium on Electronic Materials & Packaging, 2000, pp. 470–475.

Li et al., "Stencil Printing Process Development for Flip Chip Interconnect," IEEE Transactions Part C: Electronics Packaging Manufacturing, vol. 23, Issue 3, (Jul. 2000), pp. 165–170.

Lyons et al., "A New Approach to Using Anisotropically Conductive Adhesives for Flip–Chip Assembly, Part A," *IEEE Transactions on Components, Packaging, and Manufacturing Technology*, vol. 19, Issue 1, Mar. 1996, pp. 5–11.

Teo et al., "Enhancing Moisture Resistance of PBGA," *Electronic Components and Technology Conference*, 1988. 48$^{th}$ IEEE, 25–28 May 25–28, 1998, pp. 930–935.

Teutsch et al., "Wafer Level CSP using Low Cost Electroless Redistribution Layer," *Electronics Components and Technology Conference*, 2000. 2000 Proceedings 50$^{th}$, May 21–24, 2000, pp. pp. 107–113.

"The 2003 International Technology Roadmap for Semiconductor; Assembly and Packaging."

Tsui et al., "Pad redistribution technology for flip chip applications," *Electronic Components and Technology Conference*, 1998. 48$^{th}$ IEEE, May 25–28, 1998, pp. 1098–1102.

Xiao et al., "Reliability study and failure analysis of fine pitch solder–bumped flip chip on low–cost flexible substrate without using stiffener," IEEE, 2002. Proceedings 52$^{nd}$, 28–31 May 28–31, 2002, pp. 112–118.

* cited by examiner

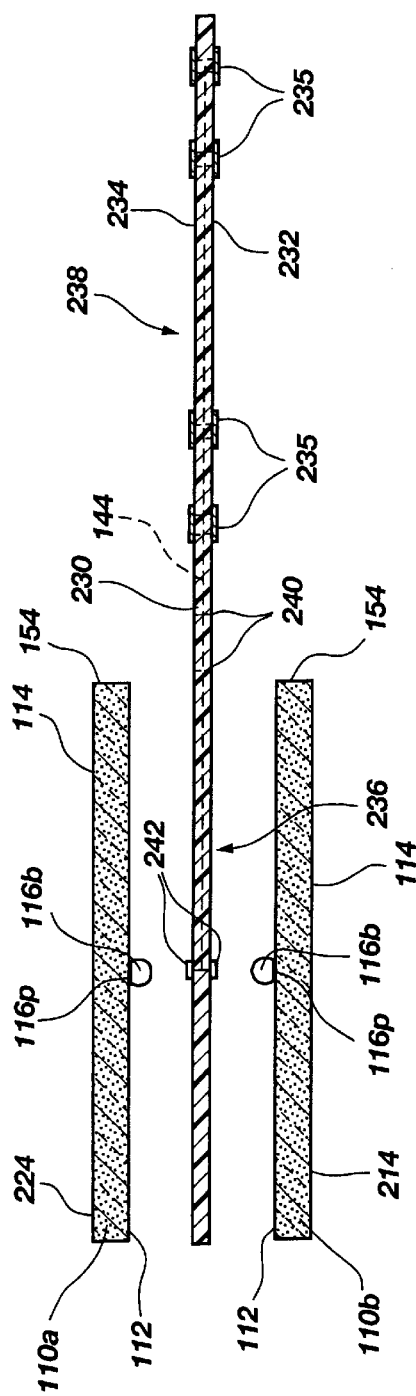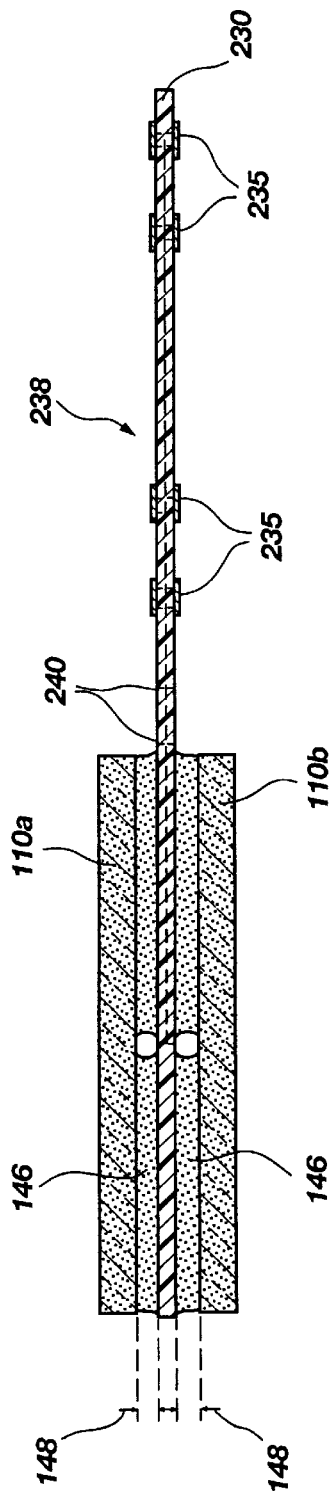
Fig. 3(a)
Fig. 3(b)

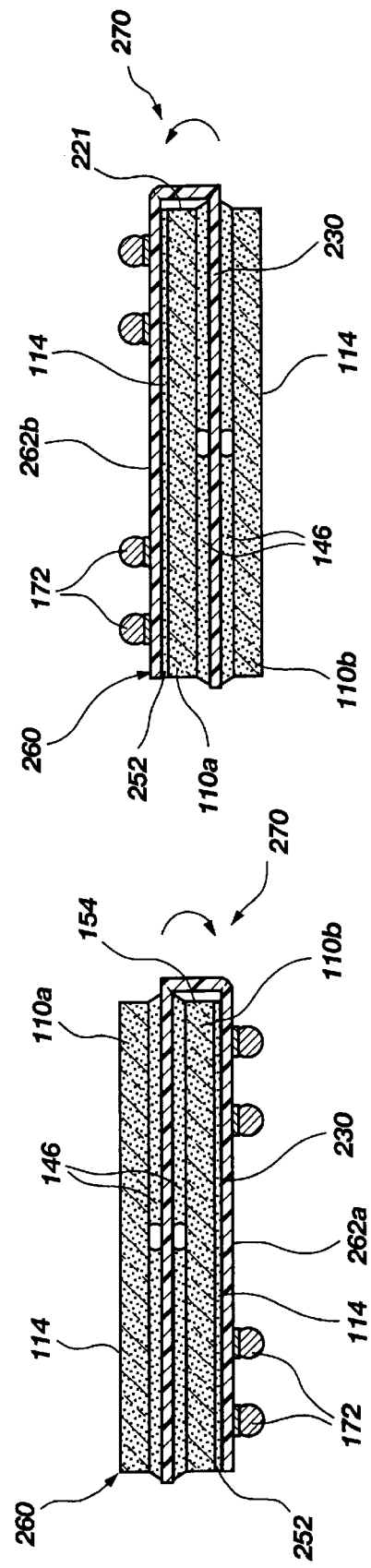

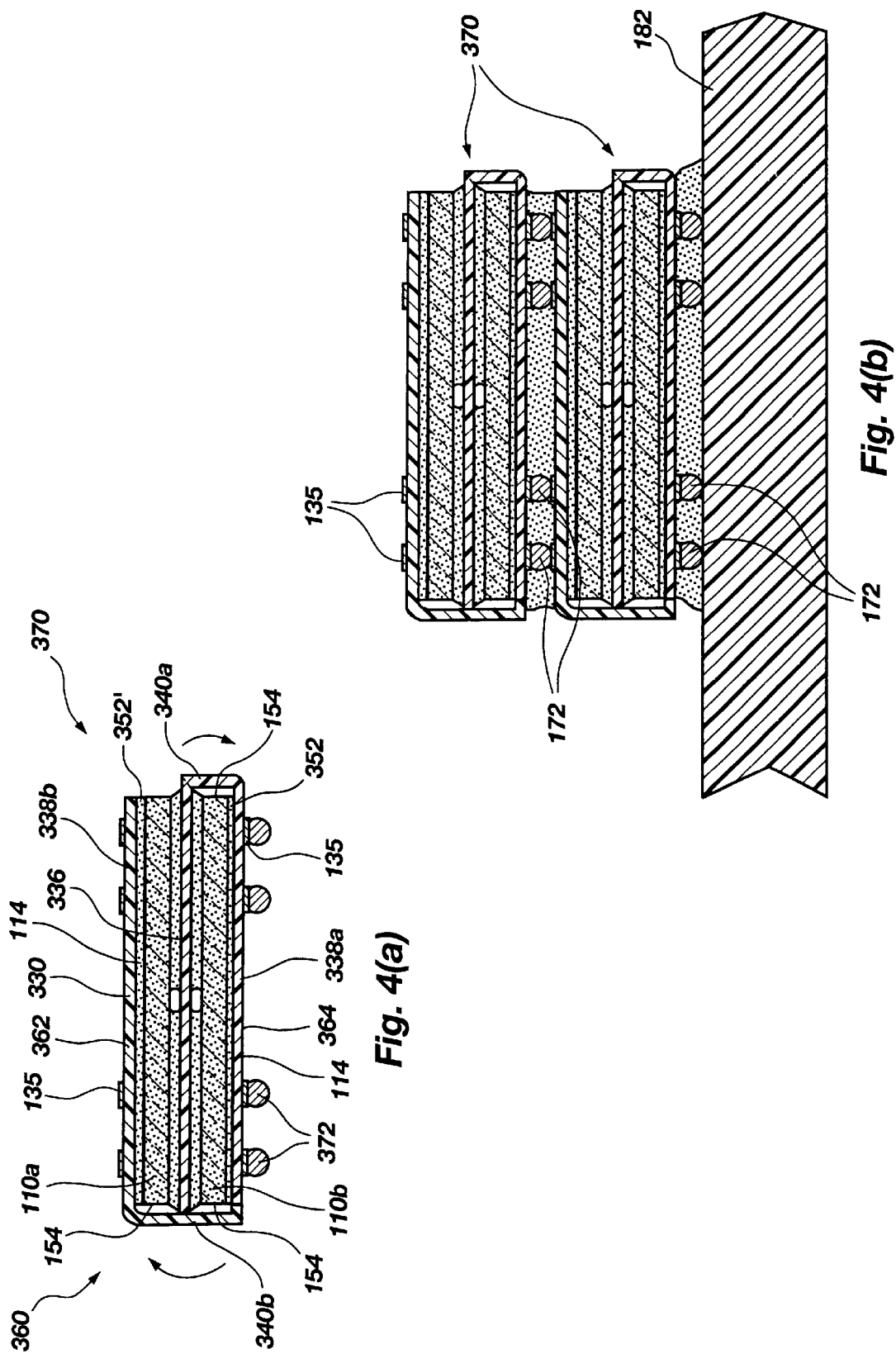

FLEXIBLE BALL GRID ARRAY CHIP SCALE PACKAGES

BACKGROUND OF THE INVENTION

Field of the Invention:

The present invention relates to methods and apparatus for packaging single and multiple semiconductor dice to provide an array-type pinout. In particular, the present invention relates to methods and apparatus for packaging semiconductor dice in the form of chip scale, ball grid array packages.

State of the Art:

Semiconductor dice are conventionally packaged individually in plastic or, less commonly, ceramic packages. Packaging supports, protects, and dissipates heat from the semiconductor die and provides a lead system for power and signal distribution to and from the semiconductor die. The die package also facilitates bum-in and other testing of each semiconductor die prior to and after its assembly with higher level packaging.

One type of integrated circuit (IC) or semiconductor die package is referred to as a "chip scale package," "chip size package," or merely "CSP." These designations arise largely from the physical dimensions of the package, which are only nominally larger than the actual dimensions (length, width and height) of the unpackaged semiconductor die. Chip scale packages may be fabricated in "uncased" or "cased" configurations. Uncased chip scale packages do not include an encapsulation or other covering of the sides of the semiconductor die extending between the active surface and back side thereof and, thus, exhibit a "footprint" (peripheral outline) that is substantially the same as that of an unpackaged semiconductor die. Cased chip scale packages have encapsulated or covered sides and thus exhibit a peripheral outline that is slightly larger than that of an unpackaged semiconductor die. For example, a surface area of a footprint for a conventional cased chip scale package may be up to about 1.2 times that of the bare semiconductor die contained within the package.

A chip scale package may typically include an interposer substrate bonded to the active surface of the semiconductor die. The interposer substrate may include traces extending to contacts for making external electrical connections to the semiconductor die of the chip scale package. The interposer substrate for a chip scale package may comprise a flexible material, such as a polymer (i.e., polyimide) tape, or a rigid material, such as silicon, ceramic, glass or FR-4 or other fiberglass laminate. The external contacts for one type of chip scale package include solder balls or other discrete conductive elements protruding from the package and arranged in an array. Such a design is termed a "ball grid array" (BGA), or a "fine ball grid array" (FBGA) for such an array having a very closely spaced, or pitched, array of discrete conductive elements. BGA and FBGA packaging provides the capability for a high number of inputs and outputs (I/Os) for a chip scale package, several hundred I/Os being easily achieved if necessary or desirable.

Integrated circuit packaging surface mount technology, such as so-called "vertical surface mount packages" or "VSMP" technology, has also provided an increase in semiconductor die density on a single carrier substrate or circuit board. This results in more compact designs and form factors and a significant increase in integrated circuit density. However, many VSMP designs are somewhat costly to implement and require fairly complex and sophisticated carrier substrates. In addition, for some applications, the relatively large distance of protrusion of the VSMPs above the carrier substrate unacceptably limits the number of carrier substrates which may be inserted transversely in adjacent slots of a higher level packaging substrate, such as a PC motherboard.

Higher performance, lower cost, increased miniaturization of components, and greater packaging density of integrated circuits are ongoing goals of the computer industry. As new generations of integrated circuit products are released, the volume and thus cost of components used in packaging tend to decrease due to advances in packaging technology, even though the functionality (memory capacity and speed, processor speed, etc.) of the packaged end products increases. For example, on the average, there is approximately a 10 percent decrease in packaging component usage for every product generation in comparison to the previous generation exhibiting equivalent functionality.

Chip scale packages are thus of current interest in modern semiconductor packaging as a method for reducing the package size and cost. Further, the industry has responded to the limited space or "real estate" available for mounting semiconductor dice on a carrier substrate by vertically stacking two or more semiconductor dice, the I/Os to the carrier substrate often being provided between the lowermost semiconductor die and carrier substrate within the footprint of the stack. Therefore, it would be advantageous to provide a method and apparatus that may further reduce chip scale package size and enhance robustness of the package while at the same time reducing fabrication cost and enhancing production flexibility in combination with providing a capability to stack two or more semiconductor dice of the same or different types to increase circuit density on a carrier substrate to which such a multi-die chip scale package is attached.

BRIEF SUMMARY OF THE INVENTION

The present invention relates to chip scale packages exhibiting arrays of external contacts as well as to methods of fabricating such packages including, by way of example only, ball grid array chip scale packages. The present invention provides a reduced, substantially chip scale package of robust design and which provides the capability of stacking multiple semiconductor dice. The present invention also provides a capability to convert semiconductor dice exhibiting a peripheral or central bond pad I/O arrangement into array-type chip scale packages.

The chip scale package of the present invention includes a flexible, dielectric interposer substrate having portions attached to both an active surface and a back side surface of at least one semiconductor die after folding about one side of the at least one semiconductor die to sandwich the die therebetween. The interposer substrate used with the present invention includes a thin, foldable or flexible dielectric material bearing circuit traces having terminal pads for connecting to the die or dice and for receiving discrete conductive elements thereon for connecting the die or dice to higher level packaging such as a carrier substrate.

In one embodiment of the invention, the interposer substrate is little more than twice the size (footprint) of a bare semiconductor die to be packaged. The interposer substrate includes a first portion substantially of die footprint size and having a first set of contacts arranged for attachment to at least some of the bond pads on an active surface of the semiconductor die and a second portion laterally offset from the first portion by a spacer portion and bearing a second set of contacts arranged in an array, the interposer substrate including circuit traces extending between the first and second sets of contacts. A third set of contacts arranged in an array, with traces extending thereto from the first set of contacts, may optionally be located for access on the side of the first portion opposite the first set of contacts. The first set of contacts of the first portion of the interposer substrate is mechanically and electrically connected to the bond pads, which are preferably bumped with a conductive material, by any suitable technique known in the art, after which the second portion of the interposer substrate is folded or wrapped around a side edge of the semiconductor die and adhesively attached to the back side of the semiconductor die. A dielectric under 11 may optionally be disposed between the first portion of the interposer substrate and the active surface of the semiconductor die. Discrete conductive elements such as, by way of example only, solder balls, may be formed on the second set of contacts lying over the back side of the semiconductor or, if the interposer substrate employs the third set of contacts, either the second or third set of contacts may be so bumped, as desired. If both second and third sets of contacts are provided, multiple chip scale packages according to this embodiment of the invention may be stacked.

In another embodiment of the present invention, bond pads of first and second semiconductor dice are bumped with conductive material and then attached face to face to respective first and second sets of contacts on opposing sides of a first portion of an interposer substrate. An underfill material may be optionally disposed between one or both of the first and second semiconductor dice and the interposer substrate. The second portion of the interposer substrate is then folded about a side of either the first or the second semiconductor die and bonded to the back side of the semiconductor die about which it is folded. The second portion of the interposer substrate includes conductively filled through vias extending from one side of the second portion to the other and connected to the first and second sets of contacts by conductive traces extending therebetween, To avoid shorting, the second portion may be bonded to the die back side using a nonconductive adhesive. Since the vias of the second portion of the interposer substrate extend completely therethrough and provide electrical contacts at each end thereof, discrete conductive elements may be applied thereto regardless of which semiconductor die back side is adhered to the second portion.

In a variant of the second embodiment, the second portion of the interposer substrate is extended in length and includes two longitudinally spaced second portions. With the extended second portion, a first, second portion is folded about a side of either the first die or the back side of the second die and then bonded to the back side thereof, after which a second, second portion is wrapped around the side of the other semiconductor die and bonded to the back side thereof. In this variant, each of the first and second, second portions carries a set of contacts so that a ball grid array may then be provided to either an upper outside surface or a bottom outside surface of the package, as desired. This variant of the second embodiment of the invention also provides the capability of stacking multiple chip scale packages.

Methods of fabricating the chip scale packages of the present invention, as well as assemblies of higher level packaging incorporating the inventive packages, are also contemplated as being encompassed by the invention.

BRIEF DESCRIPTION OF THE SEVERAL VIEWS OF THE DRAWINGS

The method and apparatus of the present invention will be more fully understood from the detailed description of the invention when taken in conjunction with the drawings, wherein:

FIGS. 1(a)–1(g) illustrate a method of making a flexible single semiconductor die chip scale package in accordance with a first embodiment of the present invention, in which FIG. 1(a) is a simplified perspective view and FIGS. 1(b)–1(g) are simplified cross-sectional views;

FIGS. 3(a)–3(e) are simplified cross-sectional views of a second embodiment, illustrating a method of making a flexible multiple semiconductor die stack chip scale package, in accordance with the present invention; and FIGS. 4(a)–4(b) are simplified cross-sectional views of an alternative to the second embodiment, illustrating a method for making a flexible multiple semiconductor die stack chip scale package that is stacked with another flexible multiple semiconductor die stack chip scale package, in accordance with the present invention.

DETAILED DESCRIPTION OF THE INVENTION

Figure 1A:
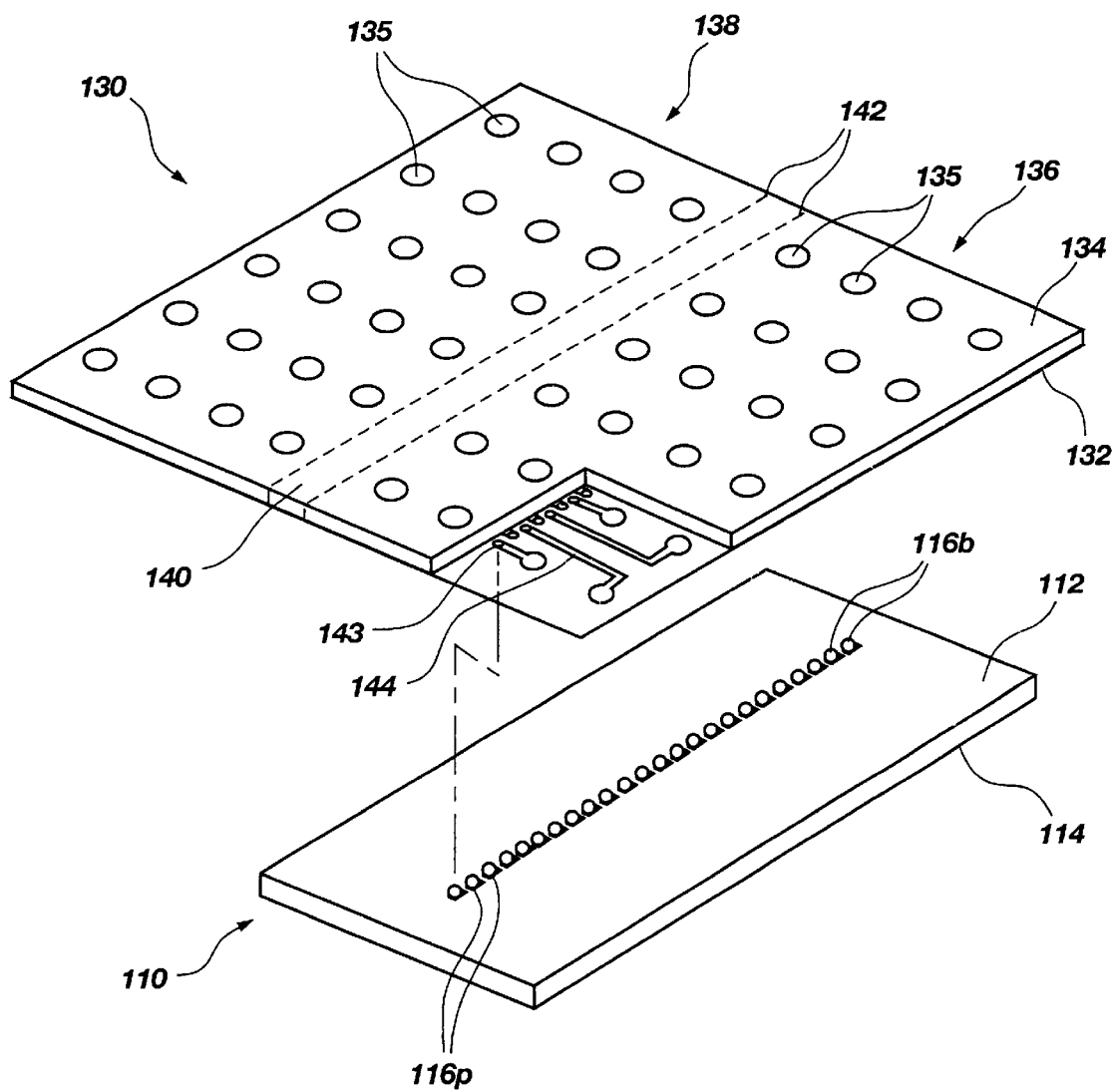

Embodiments of the present invention will be described hereinafter with reference to the accompanying drawings. It should be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same numerical designation.

A method and apparatus of a first embodiment of the present invention are shown in FIGS. 1(a)–1(g). FIG. 1(a) depicts a simplified, exploded perspective view of a die 110 and a superimposed interposer substrate 130 prior to being mutually attached. The die 110 may include a semiconductor substrate comprising a singulated semiconductor die or a plurality of unsingulated dice (also known in the art as a "partial wafer"). The semiconductor substrate may comprise, for example and not by way of limitation, silicon, gallium arsenide, indium phosphide or other semiconductor material known in the art. The semiconductor substrate may be severed from a larger substrate, for example and not by way of limitation, a silicon wafer or another substrate such as silicon-on-insulator (SOI), silicon-on-glass (SOG), etc. The die 110 includes an active surface 112 and a back side 114, the active surface 112 including a plurality of bond pads 116p bearing electrically conductive bumps 116b. The bond pads 116p may be centrally located as shown in FIG. 1(a) in one or more rows, or may be peripherally located along one or more edges of active surface 112, as known in the art. In addition, other bond pad arrangements may be easily accommodated.

Bumps 116b preferably comprise, but are not limited to, conductive pillars, columns, or balls. The material of conductive bumps 116b may include, but is not limited to, any known suitable metals or alloys thereof, such as lead, tin, copper, silver or gold. Conductive or conductor-filled polymers may also be employed, although gold and PbSn solder bumps are currently preferred. The bumps 116b may be of uniform characteristics throughout or include, for example, a core of a first material (including a nonconductive material) having one or more conductive layers of other materials thereon. The bumps 116b, depending upon the material or materials employed therefor, may be formed using an evaporation process, a C4 process, electroplating, electroless plating, laser bonding, or any other process as known to one of ordinary skill in the art.

The interposer substrate 130 may be a flexible dielectric tape or a ribbon type laminate structure having a first surface 132 and a second surface 134, the second surface 134 including electrical contacts thereon in the form of ball pads 135. The ball pads 135 may be formed of any suitable conductive material such as gold or tin/lead solder, the material being selected for compatibility with that of discrete conductive elements to be subsequently formed thereon. The interposer substrate 130 comprises a first portion 136 and a second, laterally offset portion 138 spaced from first portion 136 by spacer portion 140 defined between fold lines 142. Both first portion 136 and second portion 138 may have ball pads 135.

The interposer substrate 130 may be formed from any known substrate materials and is preferably formed of, by way of example, a laminated polymer material and, more specifically, a polyimide or other thermoset polymer film. In a preferred embodiment, the interposer substrate 130 may be ultra-thin with any suitable thickness, but preferably has a thickness in the range between about 70 um and about 90 um.

FIG. 1(a) also illustrates a cut-out from the interposer substrate 130 depicting the internal electrical interconnection or trace routings therein over one of the dielectric films thereof, the other being partially removed for clarity. In particular, the ball pads 135 on the second surface 134 of the interposer substrate 130 interconnect through conductive traces 144 to corresponding bond posts 143 exposed on the first surface 132 of first portion 136. Each bond post 143 is electrically connected and rerouted by way of a corresponding trace 144 to two corresponding ball pads 135 on the second surface 134 of the carrier substrate 130, one on first portion 136 and one on second portion 138. Traces 144 may be formed by masking and etching a conductive film, such as copper, on one of the dielectric films, by printing using conductive ink, or otherwise as known in the art. Bond posts 143 are formed of a conductive material compatible for bonding with bumps 116b. Although actually sandwiched between the two dielectric films of interposer substrate 130, traces 144 are shown partially revealed from the side in FIGS. 1(b) and 1(c) and partially in broken lines to better illustrate their extensions from bond posts 143 to ball pads 135.

Figure 1B:
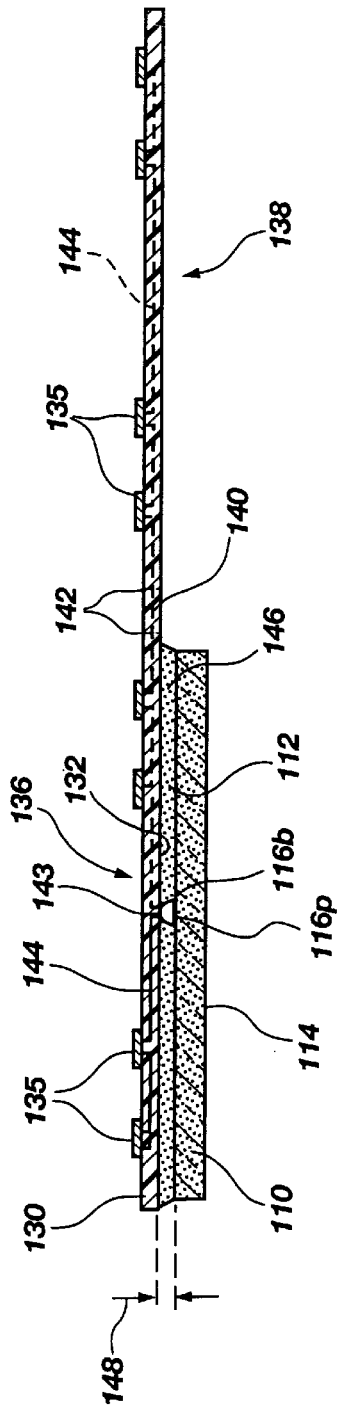

FIG. 1(b) is a simplified cross-sectional view of the die 110 mounted to the first portion 136 of interposer substrate 130. In particular, the bumps 116b on the active surface 112 of the die 110 are bonded to the bond posts 143 on the first surface 132 of the first portion 136 of the interposer substrate 130. The interposer substrate's first portion 136 is thus directly facing the active surface 112 of the die 110 so that the second portion 138 of the interposer substrate 130 is unattached and extends freely laterally from the first portion 136. The post-to-bump bonding is preferably accomplished by means of, but is not limited to, an anisotropic conductive film (ACF), an anisotropic conductive paste (ACP), a thermal compression (TC) bonding process or a thermosonic (TS) bonding process.

A dielectric filler material 146, commonly termed an "underfill" material, may be disposed in the gap 148 between active surface 112 and first surface 132 of first portion 136. Such may be particularly desirable if TC or TS bonding is employed, whereas ACF or ACP may be applied across the entire interface between active surface 112 and first surface 132. The methods employed to apply the filler material 146 to the gap 148 may include, but are not limited to, gravity dispensing, pressure injecting, combinations of pressure and vacuum to draw the material 146 into gap 148 and other suitable techniques known in the art. For example, filling the gap 148 may be accomplished by applying the filler material 146 from a dispenser, proximate either one side or two adjacent sides of the die 110. The filler material 146 may be self-curing through a chemical reaction, or a cure accelerated by heat, ultraviolet light or other radiation, or other suitable means in order to form a solid mass bonded to active surface 112 and first surface 132 of first portion 136 of interposer substrate 130.

Figure 1C:
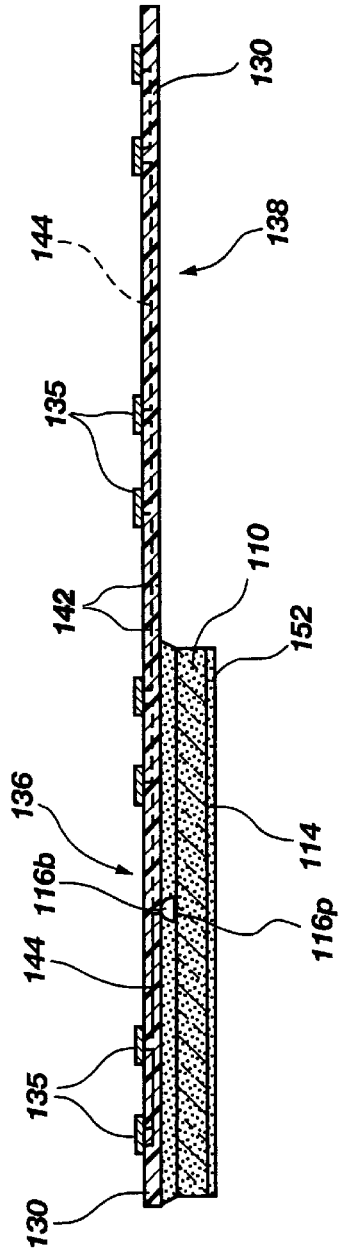

FIG. 1(c) is a simplified cross-sectional view of the die 110 mounted by active surface 112 to the interposer substrate 130 and having an adhesive material 152 on the back side 114. The adhesive material 152 may be applied to back side 114 of the die 110 subsequent to attaching the interposer substrate 130 to the die's active surface 112 or may be applied to overlie the back surface 114 at the wafer level or after dicing the wafer into individual or multiple semiconductor die/dice and before attachment to interposer substrate 130. The adhesive material 152 applied may be a double-sided adhesive tape, the outer layer of adhesive facing away from back side 114 being covered with a protective layer until adherence is required.

Figure 1D:
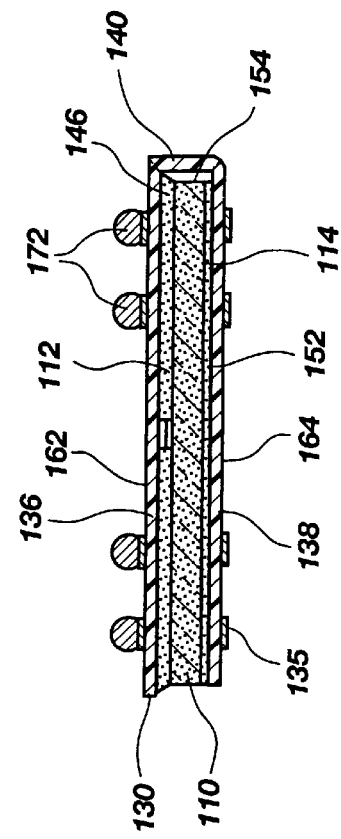

FIG. 1(d) is a simplified cross-sectional view of the interposer substrate 130 mounted to both the active surface 112 and the back side 114 of the die 110. After the die 110 and first portion 136 of the interposer substrate 130 are mounted and the adhesive material 152 has been applied to the back side 114 of the die 110, the flexible interposer substrate 130 is folded along fold lines 142 and wrapped around a side 154 of the die 110 (as shown by the arrow in FIG. 1(d)) so that the extended second portion 138 of interposer substrate 130 may be adhesively attached to the back side 114 of the die 110 via the adhesive material 152 with the spacer portion 140 of interposer substrate 130 lying over side 154 of die 110. In this manner, the first portion 136 and the second portion 138 of the interposer substrate 130 are respectively attached to the active surface 112 and the back side 114 of the die 110 to provide a wrapped die 160. In this manner, the interposer substrate 130 sandwiches the die 110 to substantially overlie the active surface 112, back side 114 and side 154. Wrapped die 160 includes a first and a second outside surface 162 and 164, respectively, each outside surface 162 and 164 comprising second surface 134 of interposer substrate 130 and exhibiting an array of ball pads 135 thereon.

Figure 1E:
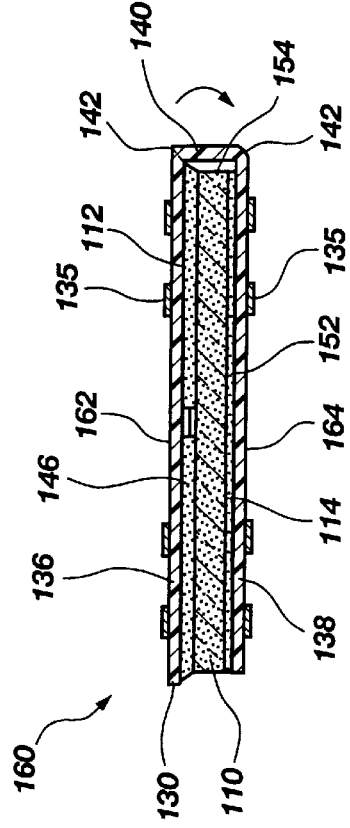
Figure 1F:
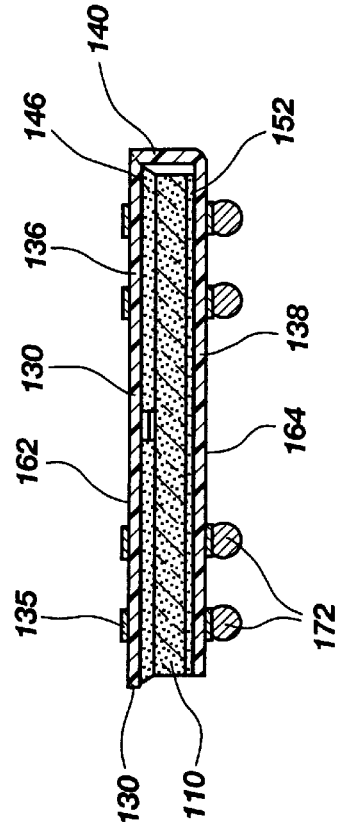

As shown in FIGS. 1(e) and 1(f), discrete conductive elements 172 may be applied to or formed on either the first outside surface 162 (FIG. 1(e)) and/or the second outside surface 164 (FIG. 1(f)) of the wrapped die 160 to complete chip scale package 170. The discrete conductive elements 172 are arranged in a two-dimensional array, commonly known as a ball grid array or BGA, corresponding to the array pattern of ball pads 135 to which discrete conductive elements 172 are bonded so as to provide external electrical connections (I/Os) for the wrapped die 160. The array may comprise rows and columns of conductive elements 172, one or more concentric circles or rectangles of bumps, and may be highly populated as illustrated herein or comprise an open array with fewer elements and large pitch (spacing) between the discrete conductive elements 172. The conductive elements 172 may comprise balls, bumps, pillars, columns or other suitable structures. The conductive elements may include, but are not limited to, any known conductive metal or alloys thereof, such as lead, tin, copper, silver, or gold as well as conductive or conductor-filled polymers. The conductive elements 172 may include a core of a first material (including nonconductive materials having one or more conductive layers thereon).

Figure 1G:
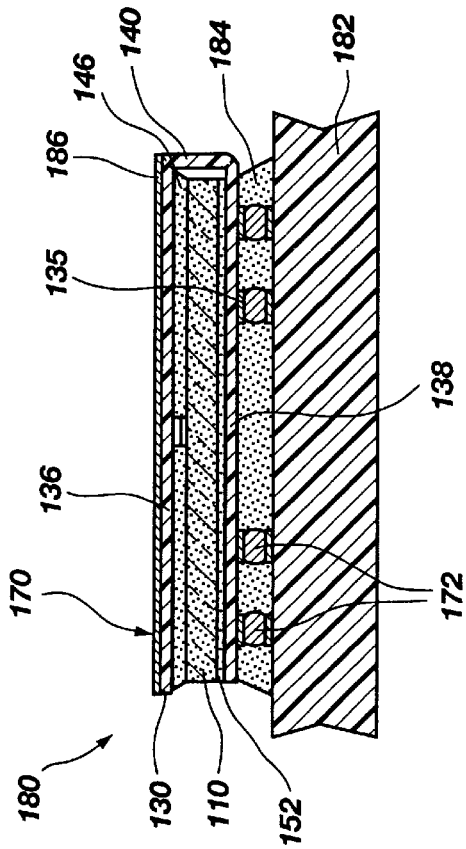

As shown in FIG. 1(g), the chip scale package 170 with conductive elements 172 attached thereto may then be mounted to a carrier substrate such as a printed circuit board (PCB) 182 or any other substrate or other higher level packaging, such as an interposer or another semiconductor die, the conductive elements 172 providing mechanical and electrical connections to terminal pads (not shown) of the other substrate. The conductive elements 172 provide a standoff between the wrapped die 160 and, for example, PCB 182. The chip scale package 170 may thus be bonded to terminal pads or trace ends of the PCB 182 by, for example, reflowing (in the case of solder) or curing (in the case of conductive or conductor-filled polymers) to form an electronic assembly as known in the art.

Once the chip scale package 170 is mounted to the PCB 182 via the conductive elements 172, a dielectric filler material 184 may then be optionally provided therebetween as known in the art for enhanced securement of chip scale package 170 and to preclude shorting between conductive elements 172.

In addition, a nonconductive layer or film 186 may optionally be applied to overlie the outside surface 162 or 164 of the wrapped die 160 having no conductive elements 172 thereon. The insulating layer or film 186 prevents electrical shorting between exposed, laterally adjacent ball pads 135 which, for clarity, are not shown in FIG. 1(g) as they are covered by film 186. This insulating layer or film 186 may be applied subsequent to, or preferably prior to, mounting the wrapped die 160 to the PCB 182.

It will be appreciated by those of ordinary skill in the art that the above-described first embodiment of the chip scale package of the present invention provides an extremely thin package offering the flexibility of bumping either the active surface or back side of a semiconductor die. Thus, a so-called "mirror" die (i.e., a die having a mirror image I/O array to another, similar die) may be easily formed without retooling. It is further appreciated that the minimized height of the chip scale package of the present invention is accomplished by easily manipulating a preformed, ultra thin, flexible interposer substrate to provide the wrapped die rather than through complex and expensive alterations in the die fabrication process. The present invention may be used to provide a robust chip scale package with a minimized height or thickness of as little as 0.85 mm. The present invention may substantially prevent potential damage to the semiconductor die during handling, assembly with a carrier substrate and testing of the resulting assembly, such as a memory module. During operation, the present invention may substantially protect the semiconductor die from environmental concerns since the interposer substrate is wrapped around both the active surface and back side of the die.

Figure 2B:
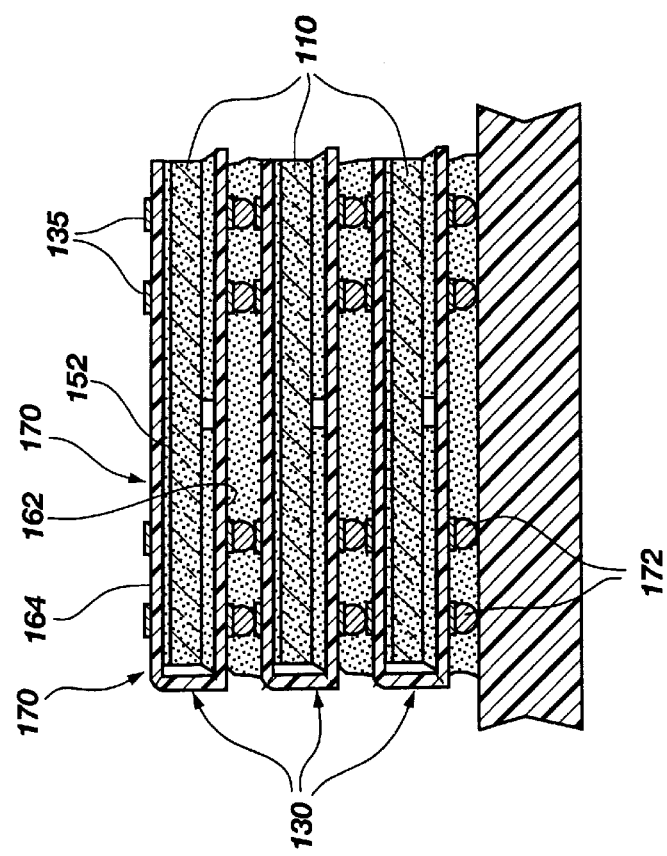
FIGS. 2(a)–2(b) are simplified cross-sectional views of the first embodiment, illustrating a flexible single semiconductor die chip scale package stacked with one or more other flexible single semiconductor die chip scale packages, in accordance with the present invention.
Figure 2A:
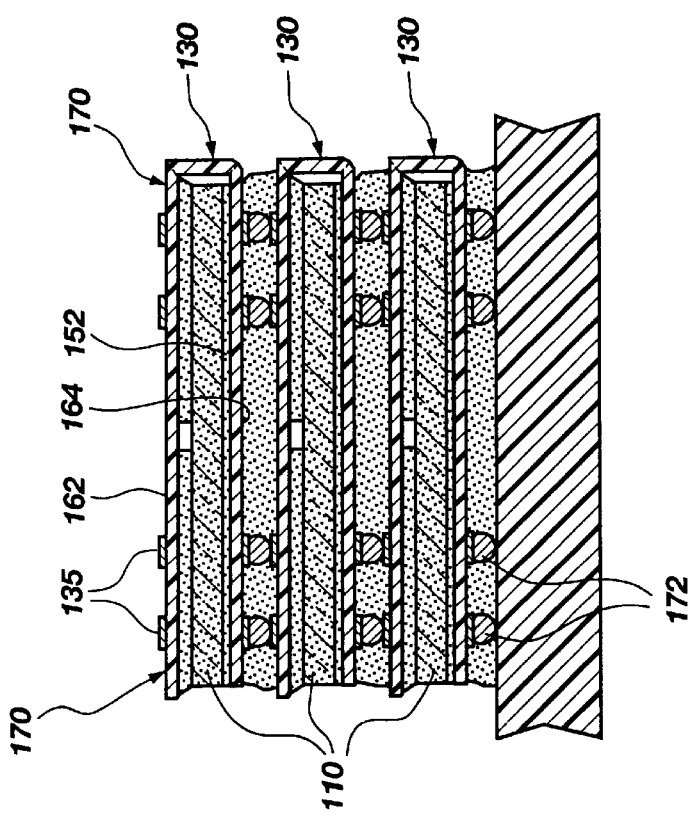

FIGS. 2(a) and 2(b) show simplified cross-sectional views of multiple CSP's of the present invention as a stacked assembly. The stacking is accomplished by mounting the conductive elements 172 of one BGA die to corresponding ball pads 135 on the first or second outside surface 162 and 164 of a wrapped die 160 of chip scale package 170. Multiple chip scale packages 170 may be stacked in a similar manner to significantly multiply the integrated circuit density, the bottom chip scale package 170 being mounted to a PCB or any other carrier substrate or higher level packaging. FIGS. 2(a) and 2(b) depict stacking the chip scale packages 170 in different orientations corresponding to the different orientations shown and described in association with FIGS. 1(e) and 1(f), respectively. It will be appreciated that different types of dice may be stacked, for example, a logic die on a memory die, or an SRAM die on a DRAM die. Alternatively, a plurality of memory dice may be stacked to effectively provide a virtual, single stack memory "module" of enhanced memory capacity or memory and logic dice may be stacked on a microprocessor die to provide a chip scale computer. Further, another BGA die of different design may be stacked on a chip scale package of the present invention and bonded to exposed ball pads thereon.

The decision of proceeding to bump the first or second outside surface 162, 164 of the wrapped die 160 may be made just prior to adding the conductive elements 172 to complete the chip scale package 170, providing additional flexibility in the planning and production of the chip scale package 170 of the present invention. Furthermore, should the orientation of the wrapped die 160 need to be reversed or flipped, this may easily be achieved by removing the conductive balls 172 from ball pads 135 on one surface of the wrapped die 160 and adding the conductive balls 172 to the ball pads 135 on the opposite surface of the wrapped die 160.

A method and apparatus of a second embodiment of the present invention is shown in FIGS. 3(a)–3(e). The second embodiment of the present invention is similar to the first embodiment in major aspects, the second embodiment including an additional semiconductor die.

As shown in the simplified cross-sectional view in FIG. 3(a), the second embodiment includes first and second dice 110a and 110b. The first and second dice 110a and 110b each include an active surface 112 and a back side 114 respectively and may include conductive bumps such as solder bumps or gold stub bumps 116b formed on or attached to bond pads 116p on the active surfaces 112 thereof As in the first embodiment, the bond pads 116p may be formed in an arrangement such as one or more rows centrally located on the active surfaces 112 or, alternatively, arranged along a periphery thereof FIG. 3(b) is a simplified cross-sectional view of the first and second dice 110a and 110b attached to an interposer substrate 230. The first and second dice 110 may be attached to first portion 236 of interposer substrate 230 employing the same processes as discussed with respect to the first embodiment, either simultaneously or sequentially. As shown in FIG. 3(a), interposer substrate 230 is structured in a manner similar to that of interposer substrate 130, being a laminate of two dielectric films having conductive traces 144 extending therebetween. However, conductive traces 144 of interposer substrate 230 extend from metallization pads 242 to an array of conductive pads through vias 235 extending from a first surface 232 of interposer substrate 230 to a second, opposing surface 234.

As shown in FIGS. 3(c) and 3(d), the arrangement of the second embodiment provides for the second portion 238 of the interposer substrate 230, being freely extended laterally from first portion 236 and separated therefrom by spacer portion 240 as shown in FIG. 3(b), to fold or wrap around either a side 154 of the first die 110a (FIG. 3(d)) or a side 154 of the second die 110b (FIG. 3(c)). Prior to folding the interposer substrate 230, a nonconductive adhesive material 252, such as Hitachi DF-400, Hitachi HM-122 and Lintec LE-5000X, may be applied to the back side 114 of the first or second die 110a and 110b to which second portion 238 is to be adhered. The nonconductive adhesive material 252 may be applied at any time prior to folding the interposer substrate 230 to be attached thereon, which may include applying the adhesive on the back sides 114 at the wafer level or subsequent to dicing the wafer. Thus, the second portion 238 of the carrier substrate 230 may fold around and be adhesively attached to either the back side 114 of the first die 110a or the back side 114 of the second die 110b to form a stacked die assembly 260.

Figure 3E:
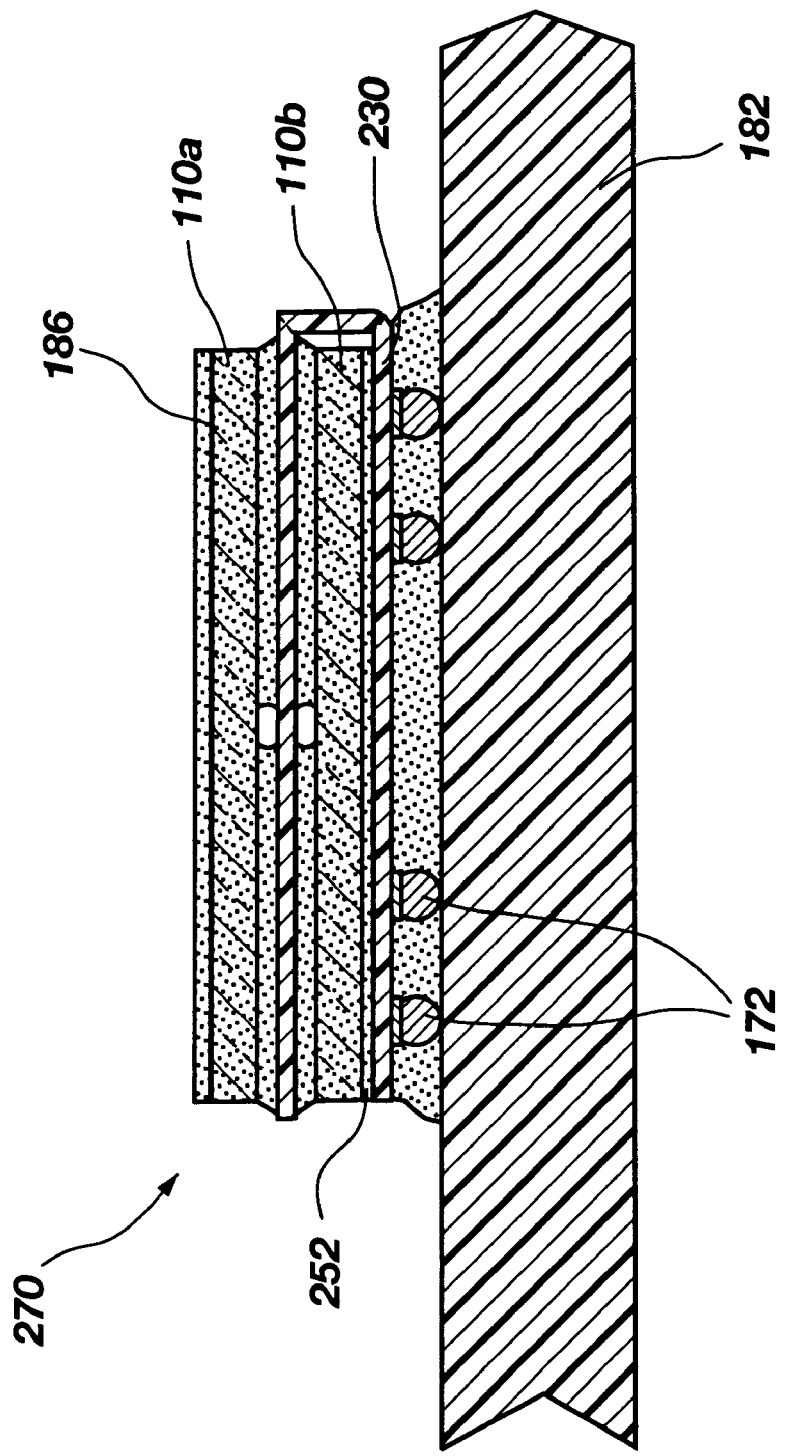

An array of discrete conductive elements 172 may then be applied to the side of stacked die assembly 260 on the exposed outside surface 262a (FIG. 3(c)) or 262b (FIG. 3(d)) of the interposer substrate 230 to form a multi-die chip scale package 270. Specifically, the discrete conductive elements 172 are applied to or formed on exposed surfaces of through vias 235 of the interposer substrate 230, the exposed surfaces on the via ends comprising ball pads as in the first embodiment described above. The conductive elements 172 may be of any suitable configuration and material or materials, as previously described above. The conductive filling of the through vias 235 may be selected to be compatible with the conductive material of discrete conductive elements 172 or the exposed surfaces of the through vias 235 may be plated for better bonding with the conductive elements 172, as well known in the art. Furthermore, as shown in FIG. 3(e), a dielectric or insulating layer or film 186 may optionally be applied to the exposed back side 114 of the first or second die 110a or 110b, depending upon which die is not covered with second portion 238 of interposer substrate 230. This insulating layer 186 may also be optionally provided at the wafer level or after the wafer is diced into individual semiconductor dice. The insulating layer 186 may be provided to overlie the chip scale package 270 as a covering for physical protection of the die and to reduce the potential for shorting of the assembly in use. If the covered die is of a type wherein the back side is voltage biased, the use of insulating layer 186 is particularly desirable.

As depicted in FIG. 3(e), the chip scale package 270 may be attached to terminal pads or other conductive structures of a carrier substrate such as PCB 182 or any other higher level packaging by the array of discrete conductive elements 172. The manner of attachment is dependent upon the type of discrete conductive elements 172 employed, as described above. Also, in a similar manner to that described in the previous embodiment, the discrete conductive elements 172 provide a standoff between the stacked die assembly 260 and the PCB 182, into which a dielectric filler material may be introduced as well known in the art.

Thus, it is apparent that the second embodiment of the chip scale package of the present invention encompasses a novel and unobvious method and apparatus and provides the capability to fabricate an ultra thin, stacked multiple die, chip scale package of no more than approximately 1.0 mm in height. Further, the option of attaching the second portion 238 of the interposer substrate 230 to the back side 114 of either the first or second die 110a or 110b may be determined just prior to actual attachment thereof, providing additional flexibility in the planning, production and in-line balancing of the chip scale package of the present invention. As with the first embodiment, the dual attachment capability facilitates the fabrication of mirror-image packages.

In FIGS. 4(a)–4(b), a variant of the second embodiment is illustrated. Previously identified components and features are identified by the same reference numerals. This variant is similar to the second embodiment except that the interposer substrate 330 is extended in length and comprises a first portion 336, first spacer portion 340a and two second portions 338a and 338b separated by a second spacer portion 340b. With this configuration, the second portions 338a and 338b may be wrapped about the back sides 114 of both the first die 110a and the second die 110b by folding the two second portions 338a and 338b about the side 154 of one of the dice 110a, 110b, covering that side 154 with the first spacer portion 340a, securing second portion 338a on the back side 114 of the one of the dice 110a, 110b, then covering the two adjacent sides 154 of the dice 110a, 110b on the other side of the assembly with second spacer portion 340b and securing second portion 338b to the back side 114 of the other of dice 110a, 110b to form a stacked die assembly 360. Both second portions 338a and 338b may include an array of ball pads 135 to which traces 144 (not shown) extend from contact points with the bond pads of the dice 110a, 110b. This variant of the second embodiment thus provides both an upper outside surface 362 and a lower outside surface 364, on which discrete conductive elements 172 may be placed in an array corresponding to the pattern of ball pads 135. As in the second embodiment, the stacked die assembly 360 with discrete conductive elements 172 forming a chip scale package 370 may then be attached to terminal pads or other contacts of a carrier substrate such as a printed circuit board 182 or any other higher level packaging. However, in this variant of the second embodiment, the chip scale package 370 may be stacked with one or more other chip scale packages 370 bearing discrete conductive elements 172 since the interposer substrate 330 wraps around both the upper and bottom outside surfaces 362 and 364 to enable electrical connection with another stacked die assembly 360. It will also be readily appreciated by those of ordinary skill in the art that another flip-chip type die or a stacked die assembly of different design may be connected to a stacked die assembly, and that dice with different functions may be combined into a stacked die assembly or connected thereto. Thus, this variant of the second embodiment provides even further advantages of increasing integrated circuit density.

It will be understood and appreciated by those of ordinary skill in the art that a die having a first arrangement of bond pads on an active surface thereof (for example, a central row), may be combined into a dual die assembly with a second, different arrangement of bond pads (for example, two peripheral rows on opposing edges of the active surface) through appropriately configuring the interposer substrate contacts and traces. Further, different die generations, i.e., one or more "shrinks" of a basic design, may be combined into an assembly.

While the present invention has been disclosed in terms of certain preferred embodiments and alternatives thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A semiconductor die assembly comprising:
    a first semiconductor die having an active surface, an opposing back side and a side extending transversely therebetween;
    a plurality of bond pads over the active surface in a first arrangement; and
    a flexible dielectric interposer substrate having first and second opposing sides and first and second adjacent portions laterally separated by a spacer portion; and the first portion including a first plurality of electrical contacts on the first side thereof connected to substantially all the bond pads of the plurality and communicating through conductive traces with at least a second plurality of electrical contacts on the second side of the second portion in a second arrangement different from the first arrangement, said flexible dielectric interposer further including a third plurality of electrical contacts on the second side of the first portion in a third arrangement different from the first arrangement and in communication with at least one of the first plurality of electrical contacts and the second plurality of electrical contacts through conductive traces;

wherein substantially all of the first portion of the interposer substrate extends and is secured over the active surface of the first semiconductor die, substantially all of the second portion is secured over the back side thereof and the spacer portion extends over the side thereof.

2. The semiconductor die assembly of claim 1, further including discrete conductive elements disposed over the electrical contacts of the second plurality and projecting transversely therefrom.

3. The semiconductor die assembly of claim 2, wherein the second arrangement comprises a two-dimensional array.

4. The semiconductor die assembly of claim 1, wherein the third arrangement is a mirror image of the second arrangement.

5. The semiconductor die assembly of claim 4, wherein the second arrangement comprises a two-dimensional array.

6. The semiconductor die assembly of claim 1, further including discrete conductive elements disposed over the electrical contacts of the third plurality and projecting transversely to the active surface of the first semiconductor die.

7. The semiconductor die assembly of claim 1, further including discrete conductive elements disposed over the electrical contacts of one of the second plurality and the third plurality and projecting transversely therefrom.

8. The semiconductor die assembly of claim 7, further including a second semiconductor die disposed over the first semiconductor die and in electrical communication with the first semiconductor die through another of the second plurality and the third plurality of electrical contacts.

9. The semiconductor die assembly of claim 8, wherein the second semiconductor die includes discrete conductive elements projecting transversely therefrom, by which the electrical communication with the first semiconductor die is effected.

10. The semiconductor die assembly of claim 9, wherein the second semiconductor die is configured substantially identically to the first semiconductor die.

11. The semiconductor die assembly of claim 1, further including an underfill material disposed between the active surface of the first semiconductor die and the first side of the first portion of the interposer substrate.

12. The semiconductor die assembly of claim 1, further comprising an adhesive layer over the back side of the first semiconductor die securing the second portion of the interposer substrate thereto.

13. The semiconductor die assembly of claim 1, wherein the first and second portions of the interposer substrate are each of a length and width substantially corresponding to a length and width of the first semiconductor die.

14. A semiconductor die assembly comprising:

a first semiconductor die having an active surface, an opposing back side, a side extending transversely therebetween and a plurality of bond pads over the active surface in a first arrangement;

a second semiconductor die having an active surface, an opposing back side, a side extending transversely therebetween and a plurality of bond pads over the active surface thereof in a second arrangement; and a flexible dielectric interposer substrate having first and second opposing sides and first and second adjacent portions laterally separated by a first spacer portion and including:

a first plurality of electrical contacts on the first side of the first portion connected to substantially all of the bond pads of the plurality of the first semiconductor die;

a second plurality of electrical contacts on the second side of the first portion connected to substantially all of the bond pads of the plurality of the second semiconductor die; and a third plurality of electrical contacts on at least one of the first and second sides of the second portion and in communication through conductive traces with the first and second pluralities of electrical contacts, the third plurality of contacts being in a third arrangement differing from the first and second arrangements;

wherein substantially all of the first portion of the interposer substrate extends and is secured between the first and second semiconductor dice, substantially all of the second portion is secured over the back side of one of the first and second semiconductor dice with the electrical contacts of the third plurality accessible and the first spacer portion extends over the side of the one of the first and second semiconductor dice to which the second portion is secured.

15. The semiconductor die assembly of claim 14, wherein the first and second arrangements are identical.

16. The semiconductor die assembly of claim 14, wherein the second arrangement comprises a mirror image of the first arrangement.

17. The semiconductor die assembly of claim 14, wherein the third plurality of electrical contacts is exposed on both the first and second sides of the second portion.

18. The semiconductor die assembly of claim 17, wherein the electrical contacts of the third plurality comprise conductive material-filled vias extending from the first side of the second portion to the second side of the second portion of the interposer substrate.

19. The semiconductor die assembly of claim 17, further comprising discrete conductive elements disposed on and projecting transversely from accessible electrical contacts of the third plurality.

20. The semiconductor die assembly of claim 14, further comprising discrete conductive elements disposed on and projecting transversely from accessible electrical contacts of the third plurality.

21. The semiconductor die assembly of claim 14, wherein the third arrangement comprises a two-dimensional array.

22. The semiconductor die assembly of claim 14, wherein the second portion of the interposer substrate comprises two adjacent second portions laterally separated by a second spacer portion, substantially all of one second portion is secured over the back side of one of the first and second semiconductor dice, substantially all of the other adjacent second portion is secured over the back side of another of the first and second semiconductor dice, the first spacer portion extends over a side of the one of the first and second semiconductor dice and the second spacer portion extends over a side of both of the first and second semiconductor dice.

23. The semiconductor die assembly of claim 22, wherein the third plurality of electrical contacts is disposed on one of the two adjacent second portions.

24. The semiconductor die assembly of claim 23, further including discrete conductive elements disposed on the electrical contacts of the third plurality and projecting transversely therefrom.

25. The semiconductor die assembly of claim 23, further comprising a fourth plurality of electrical contacts disposed on another of the two adjacent second portions and in communication with electrical contacts of at least one of the first and second plurality through conductive traces.

26. The semiconductor die assembly of claim 25, further including discrete conductive elements disposed on the electrical contacts of either the third plurality or the fourth plurality and projecting transversely therefrom.

27. The semiconductor die assembly of claim 26, further including at least another semiconductor die disposed over the semiconductor die assembly and in electrical communication with the semiconductor die assembly through electrical contacts of either the third or fourth plurality having no discrete conductive elements disposed thereon.

28. The semiconductor die assembly of claim 27, wherein the at least another semiconductor die includes discrete conductive elements projecting transversely therefrom, by which the electrical communication with the semiconductor die assembly is effected.

29. The semiconductor die assembly of claim 28, wherein the at least another semiconductor die assembly comprises another multiple-die assembly.

30. The semiconductor die assembly of claim 14, further including an underfill material respectively disposed between the active surfaces of the first semiconductor die and the second semiconductor die and the first and second sides of the first portion of the interposer substrate.

31. The semiconductor die assembly of claim 14, further comprising an adhesive layer over the back side of the one of the first semiconductor die and the second semiconductor die having the second portion of the interposer substrate secured thereto.

32. The semiconductor die assembly of claim 14, wherein the first and second portions of the interposer substrate are each of a length and width substantially corresponding to a length and width of at least one of the first semiconductor die and the second semiconductor die.

33. A semiconductor die assembly comprising:
first and second semiconductor dice having mutually facing active surfaces;
a flexible dielectric interposer substrate having first and second opposing sides and first and second adjacent portions laterally separated by a spacer portion, substantially all of the first portion being disposed between the first and second semiconductor dice and substantially all of the second portion being secured over a back side of one of the first and second semiconductor dice with the spacer portion extending over a side of the semiconductor die over which the second portion is secured, the interposer substrate further including conductive traces electrically respectively electrically connected to substantially all of the first and second semiconductor dice on the first and second opposing sides of the first portion and extending between the first portion and the second portion to an array of discrete conductive elements projecting from the second portion on the back side of the one of the first and second semiconductor dice to which the second portion is secured.

34. An interposer substrate for use with at least one semiconductor die having an active surface and a back side, the interposer substrate comprising:

a flexible dielectric substrate having a first portion sized and configured to correspond to an active surface of a first selected semiconductor die and an adjacent second portion laterally separated by a spacer portion and sized and configured to correspond to an active surface of a second selected semiconductor die;
a first plurality of electrical contacts on a first side of the first portion arranged to mate with substantially of the bond pads of the first selected semiconductor die and connected to a second plurality of electrical contacts on a side of a second portion of the interposer substrate through conductive traces, the second plurality of electrical contacts being in a different arrangement than the first plurality of electrical contacts; and
a third plurality of electrical contacts on a second side of the first portion, arranged to mate with substantially all of the bond pads of the second selected semiconductor die and electrically connected through conductive traces to electrical contacts of the second plurality.

35. The interposer substrate of claim 34, further comprising a fourth plurality of electrical contacts on another side of the second portion electrically connected to the electrical contacts of the first and third pluralities through conductive traces.

36. The interposer substrate of claim 35, wherein the second and fourth pluralities of electrical contacts are connected.

37. The interposer substrate of claim 36, wherein the second and fourth pluralities of electrical contacts lie at opposing ends of conductive vias extending transversely through the second portion.

38. The interposer substrate of claim 35, wherein the second and fourth pluralities of electrical contacts comprise two-dimensional arrays.

39. The interposer substrate of claim 38 wherein the two-dimensional arrays comprise mirror images.

40. An electronic assembly, comprising:
a semiconductor die assembly comprising:
first and second semiconductor dice having mutually facing active surfaces;
a flexible dielectric interposer substrate having first and second opposing sides and first and second adjacent portions laterally separated by a spacer portion, substantially all of the the first portion being disposed between the first and second semiconductor dice and substantially all of the second portion being secured over a back side of one of the first and second semiconductor dice with the spacer portion extending over a side of the semiconductor die over which the second portion is secured, the interposer substrate further including conductive traces respectively electrically connected to substantially all of the bong pads of the first and second semiconductor dice on opposing sides of the first portion and extending between the first portion and the second portion to an array of discrete conductive elements projecting from the second portion on the back side of the one of the first and second semiconductor dice to which the second portion is secured; and
a higher level packaging structure connected to the semiconductor die assembly through the discrete conductive elements.

41. The electronic assembly of claim 40, wherein the higher level packaging structure comprises a computer.

* * * * *

UNITED STATES PATENT AND TRADEMARK OFFICE
CERTIFICATE OF CORRECTION

PATENT NO. : 7,115,986 B2 Page 1 of 1
APPLICATION NO. : 09/874631
DATED : October 3, 2006
INVENTOR(S) : Moon et al.

It is certified that error appears in the above-identified patent and that said Letters Patent is hereby corrected as shown below:

In column 11, line 3, in Claim 1, after "all" insert -- of --.

In column 14, line 45, in Claim 40, after "of the" delete "the".

In column 14, line 54, in Claim 40, delete "bong" and insert -- bond --, therefor.

Signed and Sealed this

Fifteenth Day of April, 2008

JON W. DUDAS
*Director of the United States Patent and Trademark Office*